United States Patent
Liu et al.

(10) Patent No.: US 8,995,175 B1
(45) Date of Patent: Mar. 31, 2015

(54) MEMORY CIRCUIT WITH PMOS ACCESS TRANSISTORS

(75) Inventors: Jun Liu, Milpitas, CA (US); Irfan Rahim, Milpitas, CA (US); Yanzhong Xu, Santa Clara, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 52 days.

(21) Appl. No.: 13/350,575

(22) Filed: Jan. 13, 2012

(51) Int. Cl.
G11C 11/412 (2006.01)
G11C 5/14 (2006.01)

(52) U.S. Cl.
CPC .................................. G11C 5/14 (2013.01)
USPC .......................................... 365/154; 365/203

(58) Field of Classification Search
CPC ............ G11C 11/412–11/4125; G11C 7/1048; G11C 7/12; G11C 5/146
USPC .................................. 365/154, 156
See application file for complete search history.

(56) References Cited

U.S. PATENT DOCUMENTS

| | | | |
|---|---|---|---|
| 4,856,106 A * | 8/1989 | Teraoka .......................... 365/203 |
| 5,548,228 A * | 8/1996 | Madurawe ....................... 326/41 |
| 5,596,524 A | 1/1997 | Lin et al. | |
| 5,719,507 A | 2/1998 | Mehrotra | |
| 6,188,628 B1 * | 2/2001 | Tomotani ....................... 365/226 |
| 6,233,177 B1 | 5/2001 | Shokouhi et al. | |
| 6,624,459 B1 * | 9/2003 | Dachtera et al. .............. 257/296 |
| 6,657,911 B2 * | 12/2003 | Yamaoka et al. .............. 365/226 |
| 7,292,065 B2 * | 11/2007 | Lui et al. .......................... 326/41 |
| 7,639,557 B1 | 12/2009 | Chou et al. | |
| 8,023,348 B2 | 9/2011 | Kohler et al. | |
| 8,284,600 B1 | 10/2012 | Poplevine et al. | |
| 2005/0207210 A1 * | 9/2005 | Barth et al. .................... 365/154 |
| 2006/0187700 A1 * | 8/2006 | Ho ................................. 365/145 |
| 2006/0274569 A1 * | 12/2006 | Joshi et al. ..................... 365/154 |
| 2007/0025162 A1 | 2/2007 | Deng et al. | |
| 2009/0109785 A1 | 4/2009 | Houston et al. | |
| 2010/0238728 A1 | 9/2010 | Leung | |
| 2010/0296333 A1 * | 11/2010 | Houston ......................... 365/154 |
| 2011/0157964 A1 * | 6/2011 | McPartland et al. .......... 365/156 |

OTHER PUBLICATIONS

U.S. Appl. No. 13/181,219, filed Jul. 12, 2011, Liu et al.

* cited by examiner

*Primary Examiner* — Harry W Byrne
*Assistant Examiner* — Lance Reidlinger
(74) *Attorney, Agent, or Firm* — Mauriel Kapouytian Woods LLP; Ararat Kapouytian

(57) ABSTRACT

A memory circuit that includes a memory storage unit and access transistors coupled to the memory storage unit, where the access transistors include PMOS transistors, is described. In one implementation, the memory circuit further includes a bias clamp transistor coupled to the memory storage unit.

17 Claims, 3 Drawing Sheets

MEMORY CIRCUIT WITH PMOS ACCESS TRANSISTORS

BACKGROUND

Programmable logic devices (PLDs) (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) are well-known integrated circuits (ICs) that provide the advantages of fixed ICs with the flexibility of custom ICs. Such devices typically provide an "off the shelf" device having at least a portion that can be programmed to meet a user's specific needs.

PLDs have configuration elements that may be programmed or reprogrammed. Placing new data into the configuration elements programs or reprograms the PLD's logic functions and associated routing pathways. Configuration elements that are field programmable are often implemented as random access memory (RAM) cells, which in PLDs are sometimes referred to as "configuration RAM." Configuration RAMs are generally implemented as 6-transistor static RAM (6T-SRAM) or 8-transistor static RAM (8T-SRAM). Thus, configuration RAMs generally refer to SRAM.

The read and write access transistors in configuration RAMs are generally n-channel metal oxide semiconductor (NMOS) transistors.

SUMMARY

The current leakage (Iboff) from the NMOS transistors adds burden on the charge pump circuitry. However, p-channel metal oxide semiconductor (PMOS) transistors fabricated using previous generations of fabrication process nodes are considered weaker than NMOS transistors in terms of drain current (Id). Moreover, bias temperature and instability (BTI) shifts in threshold voltage (Vt) are greater for PMOS transistors than for NMOS transistors. As a result, NMOS transistors, rather than PMOS transistors, are used as access transistors, such as read and write access transistors.

Furthermore, PMOS transistors require a negative Vt or application of a negative bias. Transistors with negative Vt have greater process variability than transistors with non-negative Vt. The application of a negative bias involves use of a larger charge pump die area or an external negative voltage source. For this additional reason, use of PMOS transistors as access transistors is discouraged.

Despite these apparent disadvantages, embodiments of the present invention use PMOS access transistors, rather than NMOS access transistors. Relative to a comparable NMOS access transistor, a PMOS access transistor, particularly one fabricated at a process node of 32 nanometers (nm) or less, has a higher Id and a higher maximum gate voltage (Vmax). Additionally, relative to an NMOS access transistor, a PMOS access transistor has a smaller Gamma value (which is a measure of the body effect) due to lower well doping in the PMOS access transistor than the NMOS access transistor. Additionally, using PMOS access transistors allows for avoiding use of well separations between the access transistors and PMOS transistors of the memory storage unit. This allows for using less die area for the memory array.

In one aspect, an embodiment of the present invention provides a memory circuit that includes a memory storage unit and PMOS access transistors coupled to the memory storage unit. In one embodiment, the memory circuit further includes a bias clamp transistor coupled to the memory storage unit.

BRIEF DESCRIPTION OF THE DRAWINGS

The novel features of the invention are set forth in the appended claims. However, for purpose of explanation, several aspects of a particular embodiment of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
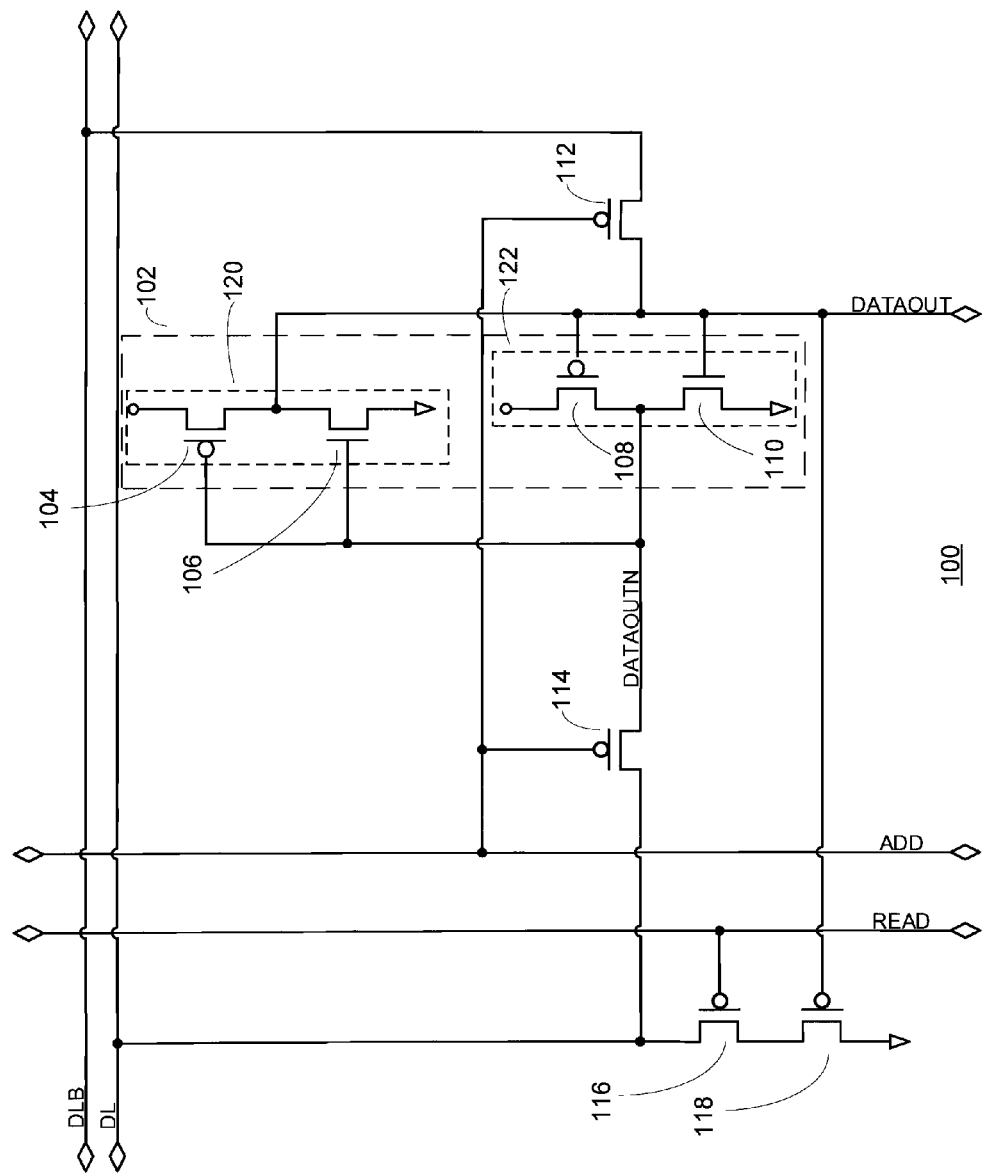
FIG. 1 is a detailed diagram of one embodiment of a memory circuit of the present invention.

FIG. 1 is a detailed diagram of one embodiment of a memory circuit of the present invention. In FIG. 1, memory circuit 100 includes memory storage unit 102 and transistors 112, 114, 116 and 118. Memory storage unit 102 includes a plurality of transistors 104, 106, 108 and 110. In one embodiment, memory storage unit 102 is a latch. As shown in FIG. 1, transistors 104 and 108 are PMOS transistors and transistors 106 and 110 are NMOS transistors. Memory storage unit 102 is coupled to write access transistors 112 and 114, which are PMOS transistors. Memory storage unit 102 is also coupled to read access transistors 116 and 118, which are PMOS transistors. Transistors 112, 114, 116 and 118 may also be coupled to one or more data, address or read lines as depicted in FIG. 1. Memory storage unit 102 includes a complementary metal oxide semiconductor (CMOS) inverter 120 coupled to a CMOS inverter 122. CMOS inverter 120 includes PMOS transistor 104 coupled in series to NMOS transistor 106. Similarly, CMOS inverter 122 includes PMOS transistor 108 coupled in series to NMOS transistor 110. In one embodiment, NMOS transistors 106, 110 and PMOS transistors 104, 108 are thick gate oxide (TGO) transistors. In one embodiment, the thick gate oxide thickness is 60 Angstroms (Å). It is to be noted that a specific parameter value used herein is not intended to be limited to exactly that specific parameter value but to also encompass approximations of that specific parameter value. For example, 60 Å is intended to include approximately 60 Å. In addition to inverters 120 and 122, memory storage unit 102 may include other components not shown in FIG. 1.

In one embodiment, memory circuit 100 is made using a 32 nm or finer scale fabrication process node. In one embodiment, memory circuit 100 is made using a 28 nm or 20 nm fabrication process node.

In one embodiment, PMOS transistors 104, 108, 112, 114, 116 and 118 have a high threshold voltage. As used herein, a high threshold voltage for a PMOS transistor is a voltage of 0.12 volts or greater. Using PMOS transistors for access transistors 112, 114, 116 and 118 advantageously results in a smaller Iboff compared to using NMOS transistors for access transistors. Iboff is the leakage current from the drain or source to the body of the transistor. In the embodiment shown in FIG. 1, the bodies of PMOS transistors 112, 114, 116 and 118 are connected to a higher voltage supply voltage (Vcchg) and a negative supply voltage (e.g., a reverse body bias (RBB)) is applied to NMOS transistors 106 and 110 in CMOS inverters 120 and 122. Vcchg is to be distinguished from Vccl (which is a lower supply voltage) that may be used for read/write operations. In one embodiment, Vcchg is 1.1 volts, whereas Vccl is 0.85 volts. In one embodiment, the negative supply voltage (such as that applied to the CMOS inverters 120 and 122) is generated internally by the IC using a charge pump (not shown). In another embodiment, the negative supply voltage is supplied from outside of the IC. RBB, which involves applying a negative body-to-source voltage to an n-channel transistor, increases the threshold voltage of the transistor and reduces leakage current (and leakage power consumption) of the chip. The use of PMOS transistors as access transistors 112, 114, 116 and 118 in the embodiment of FIG. 1, advantageously reduces the burden on charge pump circuitry, which allows RBB to be increased (i.e., made more negative) by 100 mV. The embodiment of FIG. 1 may reduce charge pump burden by approximately 70%, which may result in up to 10% reduction in total chip leakage and 10-20% increase in read/write speed.

In one embodiment, where Vccl is 0.85 volts and Vcchg is 1.1 volts, the body of access transistors 112, 114, 116, and 118 is coupled to 1.1 volts. Additionally, in such an embodiment, the drain of each of access transistors 112, 114, 116, and 118 is coupled to ground (i.e., 0 volts), the source of each of access transistors 112 and 114 is coupled to 1.1 volts, the source of each of access transistors 116 and 118 is coupled to 0.85 volts, the gate of each of access transistors 112 and 114 is coupled to −0.1 volts and 1.2 volts for having those transistors on and off, respectively, and the gates of each of access transistors 116 and 118 is coupled to −0.25 volts and 0.95 volts for having those transistors on and off, respectively.

Figure 2:
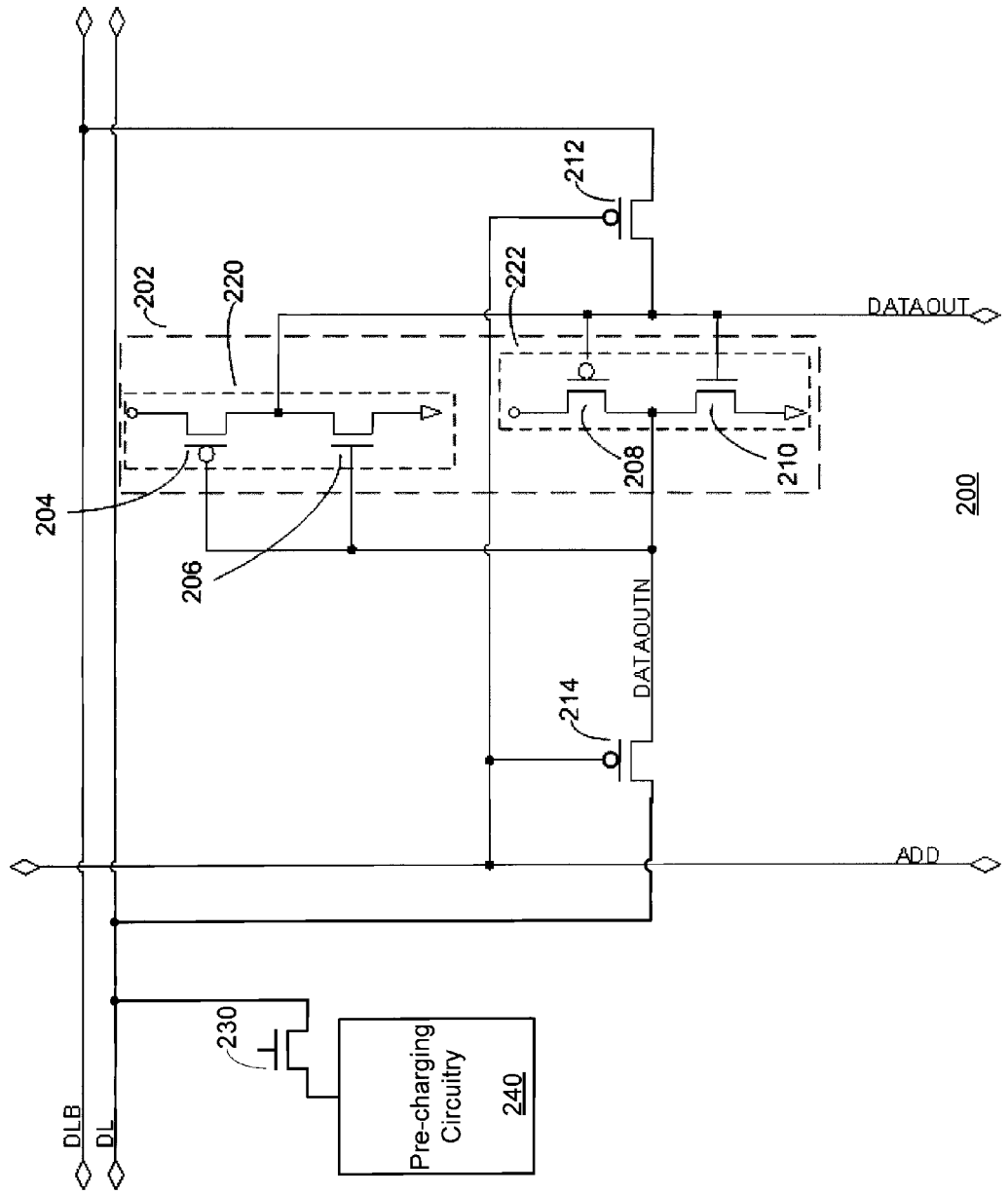
FIG. 2 is a detailed diagram of another embodiment of a memory circuit of the present invention.

FIG. 2 is a detailed diagram of another embodiment of a memory circuit of the present invention. In FIG. 2, memory circuit 200 includes memory storage unit 202 and transistors 212 and 214. Memory storage unit 202 includes a plurality of transistors 204, 206, 208 and 210. In one embodiment, memory storage unit 202 is a latch. As shown in FIG. 2, transistors 204 and 208 are PMOS transistors and transistors 206 and 210 are NMOS transistors. Memory storage unit 202 is coupled to access transistors 212 and 214, which are PMOS transistors. Transistors 212 and 214 may also be coupled to one or more data or address lines as depicted in FIG. 2. Memory storage unit 202 includes two CMOS inverters 220 and 222. CMOS inverter 220 includes PMOS transistor 204 coupled in series to NMOS transistor 206. Similarly, CMOS inverter 222 includes PMOS transistor 208 coupled in series to NMOS transistor 210. In one embodiment, NMOS transistors 206, 210 and PMOS transistors 204, 208 are TGO transistors. In addition to inverters 220 and 222, memory storage unit 202 may include other components not shown in FIG. 2.

In one embodiment, memory circuit 200 is made using a 32 nm or finer scale fabrication process node. In one embodiment, memory circuit 200 is made using a 28 nm or 20 nm fabrication process node.

In the embodiment of FIG. 2, similar to the embodiment of FIG. 1, PMOS transistors 204, 208, 212 and 214 have a high threshold voltage. Using PMOS transistors for access transistors 212 and 214 advantageously results in a smaller Iboff compared to using NMOS transistors for access transistors. In the embodiment shown in FIG. 2, the bodies of PMOS transistors 212 and 214 are connected to Vcchg and a negative supply voltage (e.g., RBB) is applied to NMOS transistors 206 and 210 in CMOS inverters 220 and 222. In one embodiment, the negative supply voltage (such as that applied to the CMOS inverters 220 and 222) is generated internally by the IC using a charge pump (not shown). In another embodiment, the negative supply voltage is supplied from outside of the IC. The use of PMOS transistors as access transistors 212 and 214 in the embodiment of FIG. 2, advantageously reduces the burden on charge pump circuitry, which allows RBB to be increased (i.e., made more negative) by 100 mV. The embodiment of FIG. 2 may reduce charge pump burden by approximately 70%, which may result in up to 10% reduction in total chip leakage and 10-20% increase in read/write speed.

In one embodiment, memory circuit 200 also includes bias clamp transistor 230 coupled to pre-charging circuitry 240 and to memory storage unit 202. In one embodiment, bias clamp transistor 230 protects (or isolates) transistors in pre-charging circuitry 240 from Vcchg. In one embodiment, bias clamp transistor 230 is a bias clamp pass transistor.

In one embodiment, where Vccl is 0.85 volts and Vcchg is 1.1 volts, the body of access transistors 212 and 214 is coupled to 1.1 volts. Additionally, in such an embodiment, the drain of each of access transistors 212 and 214 is coupled to ground (i.e., 0 volts), the source of each of access transistors 212 and 214 is coupled to 1.1 volts, and the gate of each of access transistors 212 and 214 is coupled to −0.1 volts and 1.2 volts for having those transistors on and off, respectively.

Figure 3:
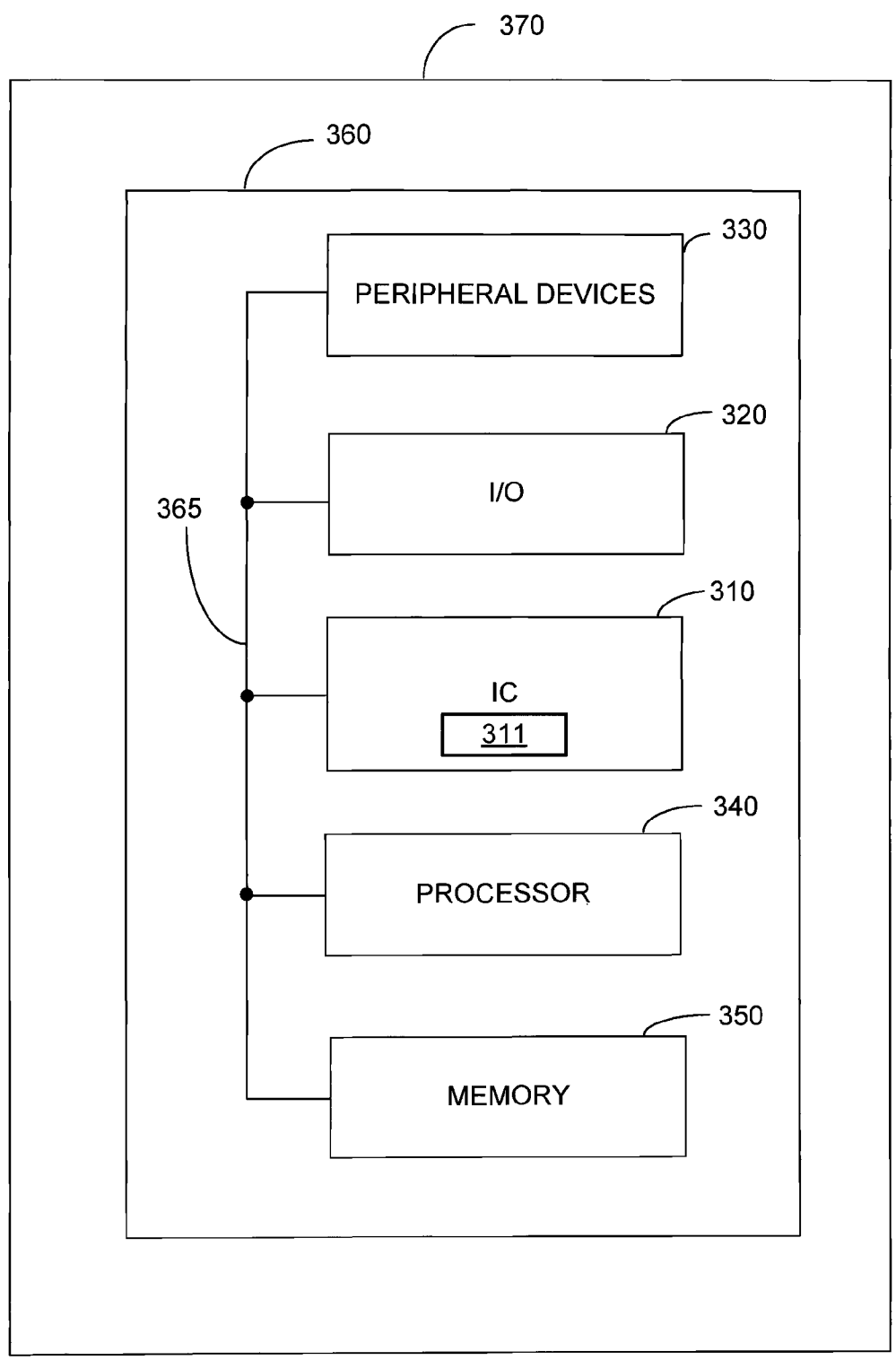
FIG. 3 illustrates an exemplary data processing system including an exemplary IC in which memory circuits in accordance with embodiments of the present invention might be implemented.

FIG. 3 illustrates an exemplary data processing system including an exemplary IC in which memory circuits in accordance with embodiments of the present invention might be implemented. FIG. 3 illustrates, by way of example, IC 310 in data processing system 300, where IC 310 includes memory circuit 311. In one embodiment, IC 310 is a PLD. Memory circuit 311 is a memory circuit according to an embodiment of the present invention, such as memory circuit 100 or 200 (shown in FIGS. 1 and 2, respectively). It is to be noted that only one memory circuit 311 is shown in IC 310 so as not to clutter the figure with details. However, those skilled in the art would appreciate that IC 310 may include many memory circuits.

In addition to IC 310, data processing system 300 may include one or more of the following components: processor 340, memory 350, input/output (I/O) circuitry 320, and peripheral devices 330. These components and IC 310 are coupled together by system bus 365 and are populated on circuit board 360 which is contained in end-user system 370. A data processing system such as system 300 may include a single end-user system such as end-user system 370 or may include a plurality of systems working together as a data processing system.

System 300 can be used in a wide variety of applications, such as computer networking, data networking, instrumentation, video processing, digital signal processing (DSP), or any other application where the advantage of using programmable or reprogrammable logic is desirable. IC 310 can be used to perform a variety of different logic functions. For example, IC 310 can be configured as a processor or controller that works in cooperation with processor 340 (or, in alternative embodiments, IC 310 might itself act as the sole system processor). IC 310 may also be used as an arbiter for arbitrating access to shared resources in system 300. In yet another example, IC 310 can be configured as an interface between processor 340 and one of the other components in system 300. It should be noted that system 300 is only exemplary.

In one embodiment, system 300 is a digital system. As used herein a digital system is not intended to be limited to a purely digital system, but also encompasses hybrid systems that include both digital and analog subsystems.

In one embodiment, at the 10 year time to device breakdown (TDDB), the stress voltage for a PMOS access transistor is 200 mV greater than that for an NMOS access transistor. In other words, a PMOS access transistor can tolerate a stress voltage that is 200 mV greater than that which can be tolerated by an NMOS access transistor. This is due to (1) the thicker oxide layer under inversion condition for the PMOS transistor than the NMOS transistor and (2) the different charge injection mechanisms used in the PMOS transistor versus the NMOS transistor. Additionally, the PMOS access transistor has a much lower stress induced leakage current (SLIC) than an NMOS access transistor as the PMOS transistor has a higher valence band off set. A higher barrier voltage results in a lower leakage current, which in turn allows for a higher Vmax.

With a smaller scale fabrication process node, the drain current in the linear mode for PMOS access transistors increases, whereas that of the NMOS access transistors remains relatively constant. Also, the Gamma value for a PMOS access transistor is lower than that for a comparable NMOS access transistor as the PMOS access transistor has a lower well doping than the NMOS access transistor. A lower Gamma value is directly related to the bulk leakage current. As a result, the bulk leakage current is lower for a PMOS access transistor than an NMOS access transistor.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A memory circuit comprising:
    a memory storage unit;
    a first access transistor coupled to the memory storage unit, wherein the first access transistor is a p-channel metal oxide semiconductor (PMOS) transistor;
    a bias clamp transistor coupled to the memory storage unit; and
    pre-charging circuitry coupled to the bias clamp transistor, wherein a body of the first access transistor is coupled to a supply voltage and wherein the bias clamp transistor isolates the pre-charging circuitry from the supply voltage,
    wherein the memory storage unit comprises a first inverter, wherein the first inverter is a first complementary metal oxide semiconductor (CMOS) inverter including a first n-channel metal oxide semiconductor (NMOS) transistor coupled in series to a first PMOS transistor, wherein a reverse body bias (RBB) is applied to the first NMOS transistor, and further wherein the first PMOS transistor is a thick gate oxide (TGO) transistor.

2. The memory circuit of claim 1, wherein the first access transistor is a read access transistor.

3. The memory circuit of claim 2, further comprising:
    a second access transistor, wherein the second access transistor is a PMOS transistor, further wherein the second access transistor is a write access transistor.

4. The memory circuit of claim 3, wherein the write access transistor is coupled to a data line, further wherein the read access transistor is coupled to the data line.

5. The memory circuit of claim 1, wherein the PMOS transistor has a high threshold voltage.

6. The memory circuit of claim 1, wherein the memory storage unit further comprises:
    a second inverter coupled to the first inverter,
    wherein the second inverter is a second CMOS inverter including a second NMOS transistor coupled in series to a second PMOS transistor.

7. A programmable logic device including the memory circuit of claim 1.

8. A digital system comprising a programmable logic device including the memory circuit of claim 1.

9. A configuration random access memory (RAM) including the memory circuit of claim 1.

10. The memory circuit of claim 1, wherein the supply voltage has a higher magnitude than a supply voltage that is used for read/write operations in the memory circuit.

11. A memory circuit comprising:
    a latch;
    a first p-channel metal oxide semiconductor (PMOS) access transistor coupled to the latch, wherein the first PMOS access transistor is a read access transistor;
    a second PMOS access transistor coupled to the latch, wherein the second PMOS access transistor is a write access transistor;
    a bias clamp transistor coupled to the latch; and
    pre-charging circuitry coupled to the bias clamp transistor, wherein the bias clamp transistor isolates the pre-charging circuitry from a supply voltage applied to a body of the first PMOS access transistor,
    wherein the latch comprises a first inverter, wherein the first inverter is a first complementary metal oxide semiconductor (CMOS) inverter including a first n-channel metal oxide semiconductor (NMOS) transistor coupled in series to a first PMOS transistor, wherein a reverse body bias (RBB) is applied to the first NMOS transistor, and further wherein the first PMOS transistor is a thick gate oxide (TGO) transistor.

12. The memory circuit of claim 11, wherein the latch further comprises:
    a second inverter coupled to the first inverter,
    wherein the second inverter is a second CMOS inverter including a second NMOS transistor coupled in series to a second PMOS transistor.

13. The memory circuit of claim 11, wherein the body of the first PMOS access transistor is coupled to the supply voltage and a body of the second PMOS access transistor is coupled to the supply voltage.

14. The memory circuit of claim 11, wherein the supply voltage has a higher magnitude than a supply voltage that is used for read/write operations in the memory circuit.

15. A method comprising:
    using a p-channel metal oxide semiconductor (PMOS) access transistor to provide access between a data line and a memory storage unit; and
    using a bias clamp transistor to isolate a pre-charging circuitry from a supply voltage applied to a body of the PMOS access transistor,
    wherein the memory storage unit includes a latch, wherein the latch includes a first inverter, wherein the first inverter is a first complementary metal oxide semiconductor (CMOS) inverter including a first n-channel metal oxide semiconductor (NMOS) transistor coupled in series to a first PMOS transistor, wherein a reverse body bias (RBB) is applied to the first NMOS transistor, and further wherein the first PMOS transistor is a thick gate oxide (TGO) transistor.

16. The method of claim 15, wherein the latch further includes a second inverter coupled to the first inverter, and wherein the second inverter is a second CMOS inverter including a second NMOS transistor coupled in series to a second PMOS transistor.

17. The method of claim 15, wherein the supply voltage has a higher magnitude than a supply voltage that is used for read/write operations in the memory storage unit.

* * * * *